(12) United States Patent
Han et al.

(10) Patent No.: US 12,399,134 B2
(45) Date of Patent: Aug. 26, 2025

(54) SUBSTRATE INSPECTION APPARATUS AND SUBSTRATE TREATMENT SYSTEM INCLUDING THE SAME

(71) Applicant: SEMES CO., LTD., Chungcheongnam-do (KR)

(72) Inventors: Jeong Hoon Han, Gyeonggi-do (KR); Oh Yeol Kwon, Chungcheongnam-do (KR); Jun Hyun Lim, Seoul (KR); Dong Min Park, Gyeonggi-do (KR)

(73) Assignee: SEMES C0., LTD., Gyeonggi-do (KR)

( * ) Notice: Subject to any disclaimer, the term of this patent is extended or adjusted under 35 U.S.C. 154(b) by 137 days.

(21) Appl. No.: 18/382,046

(22) Filed: Oct. 19, 2023

(65) Prior Publication Data

US 2024/0142389 A1    May 2, 2024

(30) Foreign Application Priority Data

Oct. 28, 2022  (KR) .......................... 10-2022-0141690

(51) Int. Cl.
  *G01N 21/95*  (2006.01)
  *G01N 21/88*  (2006.01)
  *H01L 21/66*  (2006.01)

(52) U.S. Cl.
  CPC ..... *G01N 21/9501* (2013.01); *G01N 21/8806* (2013.01); *G01N 21/8851* (2013.01); *H01L 22/24* (2013.01); *G01N 2201/061* (2013.01)

(58) Field of Classification Search
  CPC .......... G01N 21/9501; H01L 21/67757; H01L 21/67265
  See application file for complete search history.

(56) References Cited

U.S. PATENT DOCUMENTS 6,927,181 B2   8/2005   Wakizako et al.
7,008,884 B2   3/2006   Wakizako et al.
(Continued)

FOREIGN PATENT DOCUMENTS

JP    3131751       2/2001
KR    1999-0070494  9/1999
(Continued)

OTHER PUBLICATIONS

Notice of Allowance dated Nov. 13, 2024 for Korean Patent Application No. 10-2022-0141690 and its English translation by Google Translate.
(Continued)

*Primary Examiner* — Tony Ko
(74) *Attorney, Agent, or Firm* — WOMBLE BOND DICKINSON (US) LLP

(57) ABSTRACT

A substrate inspection apparatus inspecting substrates using a vision system, which includes a camera module and an illumination module, and a substrate treatment system including the substrate inspection apparatus are provided. The substrate treatment system includes: a first substrate treatment apparatus; a second substrate treatment apparatus; a transfer unit transporting a container with a plurality of substrates accommodated therein from the first substrate treatment apparatus to the second substrate treatment apparatus; and a substrate inspection apparatus inspecting the substrates, wherein the substrate inspection apparatus includes an illumination module, which illuminates in a direction where the substrates are located, a camera module, which acquires images related to the substrates when the substrates are illuminated, and a control module, which inspects the substrates based on the images.

20 Claims, 17 Drawing Sheets

(56) References Cited

U.S. PATENT DOCUMENTS

2020/0043759 A1\* 2/2020 Zhang ............... H01L 21/67248
2021/0352835 A1    11/2021 Birkner
2023/0010048 A1\*  1/2023 Fujishiro ........... H01L 21/67766

FOREIGN PATENT DOCUMENTS

| KR | 10-2005-0100022   | 10/2005 |
| KR | 10-2006-0038106   | 5/2006  |
| KR | 10-2006-0058911 A | 6/2006  |
| KR | 10-0664469        | 1/2007  |
| KR | 10-2009-0114565   | 11/2009 |
| KR | 10-1503160        | 3/2015  |
| KR | 10-2016-0112241   | 9/2016  |
| KR | 10-2022-0063526   | 5/2022  |
| KR | 10-2022-0076279 A | 6/2022  |

OTHER PUBLICATIONS

Office action from the corresponding Korean Patent Application No. 10-2022-0141690 dated Mar. 18, 2024 with English translation from Global Dossier.

\* cited by examiner

SUBSTRATE INSPECTION APPARATUS AND SUBSTRATE TREATMENT SYSTEM INCLUDING THE SAME

CROSS-REFERENCE TO RELATED APPLICATION

This application claims priority from Korean Patent Application No. 10-2022-0141690 filed on Oct. 28, 2022 in the Korean Intellectual Property Office, and all the benefits accruing therefrom under 35 U.S.C. 119, the contents of which in its entirety are herein incorporated by reference.

BACKGROUND

1. Field

The present disclosure relates to a substrate inspection apparatus and a substrate treatment system including the same, and more particularly, to a substrate inspection apparatus, which is applicable to semiconductor manufacturing processes, and a substrate treatment system including the substrate inspection apparatus.

2. Description of the Related Art

Semiconductor manufacturing processes may be performed continuously within semiconductor manufacturing equipment and may be divided into front-end and back-end processes. The front-end process refers to the process of forming circuit patterns on a wafer to complete semiconductor chips, while the back-end process refers to the process of evaluating the performance of the finished products from the front-end process.

Semiconductor manufacturing equipment may be installed within semiconductor fabrication facilities, known as "fabs," to manufacture semiconductors. Wafers may be moved through transfer modules to undergo various processes such as deposition, photolithography, etching, polishing, ion implantation, cleaning, packaging, and testing, each required for semiconductor production.

Transfer modules facilitate the transportation of wafers to equipment where each substrate treatment step is performed. During semiconductor manufacturing processes, when transfer modules transport wafers, inspection of the wafers may be carried out.

However, when inspecting wafers by measuring their distance, it is only possible to determine the presence or absence of the wafers, and it is not possible to discern the quantity or condition of the wafers.

SUMMARY

Aspects of the present disclosure provide a substrate inspection apparatus, which inspects substrates with a vision system including a camera module and an illumination module, and a substrate treatment system including the substrate inspection apparatus.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a substrate treatment system includes: a first substrate treatment apparatus; a second substrate treatment apparatus; a transfer unit transporting a container with a plurality of substrates accommodated therein from the first substrate treatment apparatus to the second substrate treatment apparatus; and a substrate inspection apparatus inspecting the substrates, wherein the substrate inspection apparatus includes an illumination module, which illuminates in a direction where the substrates are located, a camera module, which acquires images related to the substrates when the substrates are illuminated, and a control module, which inspects the substrates based on the images.

According to another aspect of the present disclosure, a substrate treatment system includes: a first substrate treatment apparatus; a second substrate treatment apparatus; a transfer unit transporting a container with a plurality of substrates accommodated therein from the first substrate treatment apparatus to the second substrate treatment apparatus; and a substrate inspection apparatus inspecting the substrates, wherein the substrate inspection apparatus includes an illumination module, which illuminates in a direction where the substrates are located, a camera module, which acquires images related to the substrates when the substrates are illuminated, and a control module, which inspects the substrates based on the images, the first substrate treatment apparatus is batch-type equipment, the second substrate treatment apparatus is single-type equipment, the substrate inspection apparatus inspects the substrates when the transfer unit transports the container, and the control module processes the images by extracting regions of interest (ROIs) from the images, binarizing the ROIs, classifying the binarized ROIs into binary large objects (BLOBs), and excluding all the BLOBs except for those associated with reflected light, and inspects the substrates based on a number of BLOBs, which is obtained as a result of the processing of the images, a result of calculation of long-axis lengths of the BLOBs, and a result of measurement of distances between the BLOBs.

According to another aspect of the present disclosure, a substrate inspection apparatus includes: an illumination module illuminating in a direction where a plurality of substrates accommodated in a container are located; a camera module acquiring images related to the substrates when the substrates are illuminated; and a control module inspecting the substrates based on the images, wherein the control module inspects the substrates when the transfer unit transports the container from a first substrate treatment apparatus to a second substrate treatment apparatus, the first substrate treatment apparatus is batch-type equipment, and the second substrate treatment apparatus is single-type equipment.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
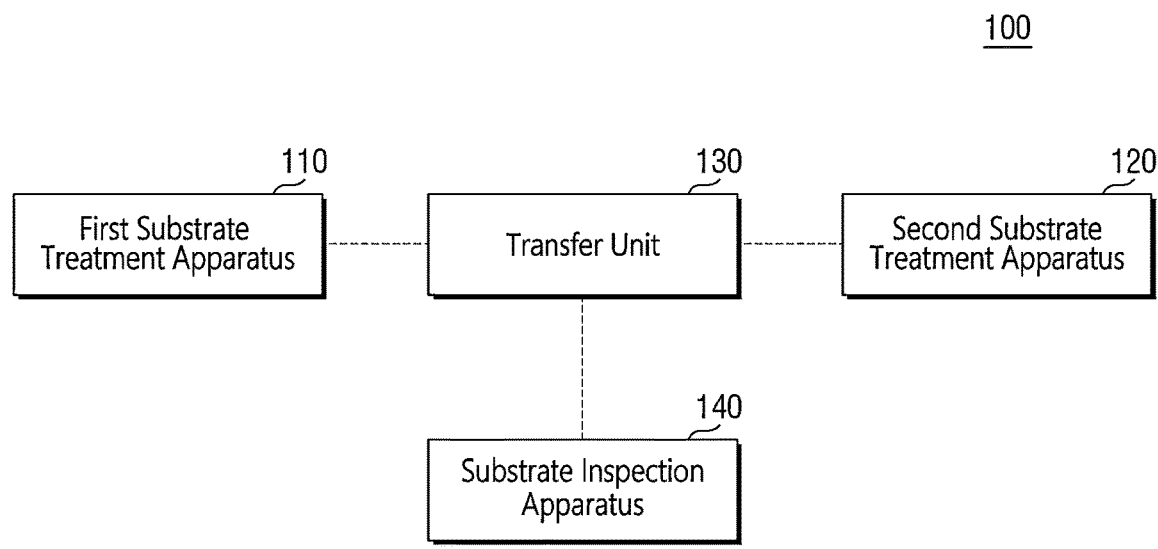
FIG. 1 is a schematic view illustrating the internal configuration of a substrate treatment system including a substrate inspection apparatus.

Embodiments of the present disclosure will hereinafter be described with reference to the accompanying drawings. Like reference numerals indicate like elements throughout the present disclosure, and thus, redundant descriptions thereof will be omitted.

A transfer module plays a role in transporting substrates (or wafers) within semiconductor manufacturing equipment. The transfer module may transport substrates from batch-type equipment to single-type equipment. Here, the batch-type equipment refers to equipment that processes multiple substrates simultaneously, while the single-type equipment refers to equipment that processes each substrate sequentially.

When transporting substrates from the batch-type equipment to the single-type equipment, the transfer module may transport multiple substrates at once. During the transportation of substrates from the batch-type equipment to the single-type equipment, the substrates are handled one-by-one by a transport robot, and if any abnormality occurs in the substrates before transportation, it is essential to properly handle such defective substrates. Therefore, inspection of the substrates before the transportation of the substrates from the batch-type equipment to the single-type equipment is crucial.

Conventionally, substrates are inspected using distance measurement sensors before being transported to the single-type equipment. According to this conventional method, substrates located on guides and fixed tools are inspected. However, this type of method has the drawback of considering repetitive recognition steps of motors during the movement of the sensors.

Moreover, the measurement of the distances to the substrates through scanning by a position sensor can determine the presence of the substrates on the guides, but cannot determine the substrates' inclination or instability, or the number of substrates. In other words, according to the conventional method of inspecting substrates, it is possible to determine the presence of the substrates, but not possible to determine the quantity of substrates or any abnormalities in the state of the substrates.

The technical idea of the present disclosure has been developed to solve such and other issues and allows the inspection of substrates using a vision system that includes a camera module and an illumination module. Detailed explanations of embodiments of the present disclosure will be provided below with reference to the accompanying drawings.

FIG. 1 is a schematic diagram illustrating the internal configuration of a substrate treatment system including a substrate inspection apparatus. Referring to FIG. 1, a substrate treatment system 100 may include a first substrate treatment apparatus 110, a second substrate treatment apparatus 120, a transfer unit 130, and a substrate inspection apparatus 140.

The first and second substrate treatment apparatuses 110 and 120 perform treatment on substrates. The first and second substrate treatment apparatuses 110 and 120 may be provided as process chambers to perform substrate treatment processes such as a deposition process, a photolithography process, an etching process, and a cleaning process.

The transfer unit 130 transports substrates between the first and second substrate treatment apparatuses 110 and 120. The transfer unit 130 may transfer substrates from the first substrate treatment apparatus 100 to the second substrate treatment apparatus 120, but the present disclosure is not limited thereto. The transfer unit 130 may also transfer substrates from the second substrate treatment apparatus 120 to the first substrate treatment apparatus 110. The transfer unit 130 may be implemented as a transfer module.

As mentioned earlier, the transfer unit 130 may transport substrates from batch-type equipment to single-type equipment. In this case, one of the first and second substrate treatment apparatuses 110 and 120 may be implemented as batch-type equipment, while the other substrate treatment apparatus may be implemented as single-type equipment.

The first and second substrate treatment apparatuses 110 and 120 will hereinafter be described as being implemented as batch-type equipment and single-type equipment, respectively. Alternatively, the transfer unit 130 may also be configured to transport substrates from batch-type equipment to batch-type equipment. The transfer unit 130 may also be configured to transport substrates from single-type equipment to single-type equipment.

When the first substrate treatment apparatus 110 is implemented as batch-type equipment, the first substrate treatment apparatus 110 may immerse multiple substrates in a tank containing a treatment liquid. For example, the first substrate treatment apparatus 110 may perform prewetting on multiple substrates by immersing the substrates in a tank filled with de-ionized water (DIW). In another example, the first substrate treatment apparatus 110 may perform etching on multiple substrates by immersing the substrates in a tank containing a first treatment liquid. In another example, the first substrate treatment apparatus 110 may perform rinsing on multiple substrates by immersing the substrates in a tank containing a second treatment liquid.

The first treatment liquid may be a chemical. For example, the first treatment liquid may be a chemical with properties of a strong acid or a strong alkali. In this example, the first treatment liquid may be selected from among chemicals such as ammonia-hydrogen peroxide mixture (or a SC-1 cleaning solution), hydrochloric acid-hydrogen peroxide mixture (or a SC-2 cleaning solution, hydrofluoric acid-hydrogen peroxide mixture (FPM), diluted hydrofluoric acid (DHF), chemicals for removing SiN, chemicals containing phosphoric acid, and chemicals containing sulfuric acid.

The second treatment liquid may be a rinse solution. The second treatment liquid may be selected from among pure water, ozone water, and the like.

Figure 2:
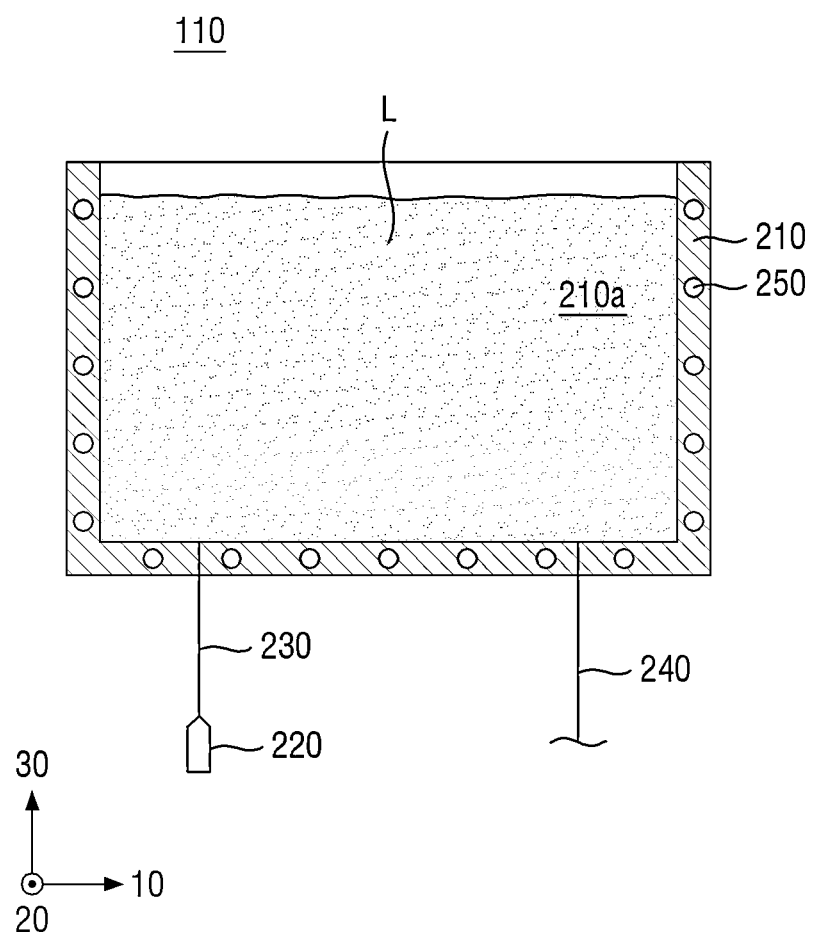
FIG. 2 is a schematic view illustrating the internal configuration of a first substrate treatment apparatus that constitutes the substrate treatment system.

If the first substrate treatment apparatus 110 treats multiple substrates by immersing the substrates in tanks containing the first treatment liquid, the second treatment liquid, or other substrate treatment liquids for etching, rinsing, etc., the first substrate treatment apparatus 110 may be configured, as illustrated in FIG. 2, to include a treatment chamber 210, a treatment liquid supply source 220, a treatment liquid supply line 230, a treatment liquid discharge line 240, and a first heating member 250.

FIG. 2 is a schematic view illustrating the internal configuration of a first substrate treatment apparatus that constitutes the substrate treatment system.

Referring to FIG. 2, the treatment chamber 210 may have an internal accommodating space 210a capable of holding a substrate treatment liquid L. The treatment chamber 210 may have an open upper end and may include sidewalls extending upwards in a third direction 30 from the edges of its bottom as viewed from the top.

The liquid supply source 220 may supply the substrate treatment liquid L, such as the first treatment liquid or the second treatment liquid, to the accommodating space 210a of the treatment chamber 210. The treatment liquid supply source 220 may be connected to the treatment liquid supply line 230. One end of the treatment liquid supply line 230 may be connected to the accommodating space 210a of the treatment chamber 210, while the other end of the treatment liquid supply line 230 may be connected to the treatment liquid supply source 220. The treatment liquid supply source 220 supplies the substrate treatment liquid L through the treatment liquid supply line 230, and the treatment liquid supply line 230 may supply the substrate treatment liquid L to the accommodating space 210a of the treatment chamber 210. Also, the substrate treatment liquid L used in the accommodating space 210a of the treatment chamber 210 may be discharged externally through the treatment liquid discharge line 240.

The first heating member 250 may regulate the temperature of the substrate treatment liquid L supplied to the accommodating space 210a of the treatment chamber 210. For example, the first heating member 250 may heat the substrate treatment liquid L supplied to the accommodating space 210a of the treatment chamber 210 to a predetermined temperature. The first heating member 250 may be provided on the bottom and the sidewalls of the treatment chamber 210. Alternatively, the first heating member 250 may be positioned within the treatment chamber 210.

The first heating member 250 may generate heat or cold to control the temperature of the substrate treatment liquid L supplied to the accommodating space 210a of the treatment chamber 210. The first heating member 250 may be a heater, but the present embodiment is not limited thereto. The first heating member 250 may be variably modifiable and applicable to nearly any type of device as disclosed, as long as it can efficiently control the temperature of the substrate treatment liquid supplied to the accommodating space 210a of the treatment chamber 210.

Figure 3A:
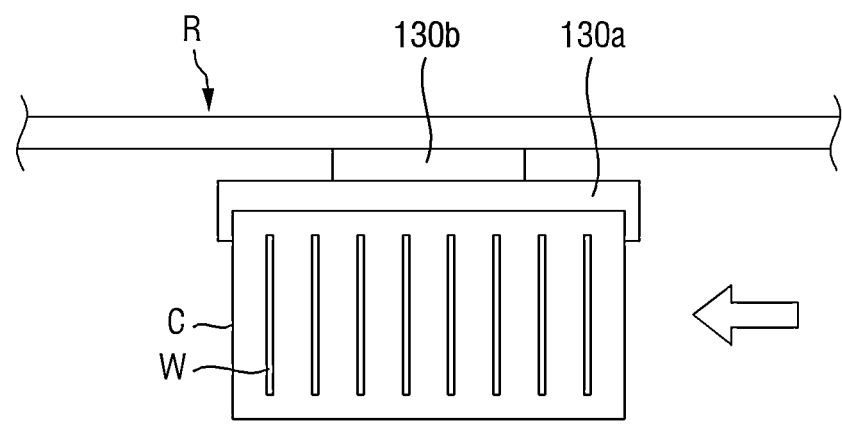
FIGS. 3A and 3B are first and second exemplary schematic views, respectively, illustrating the treatment of multiple substrates by the first substrate treatment apparatus.
Figure 3A:
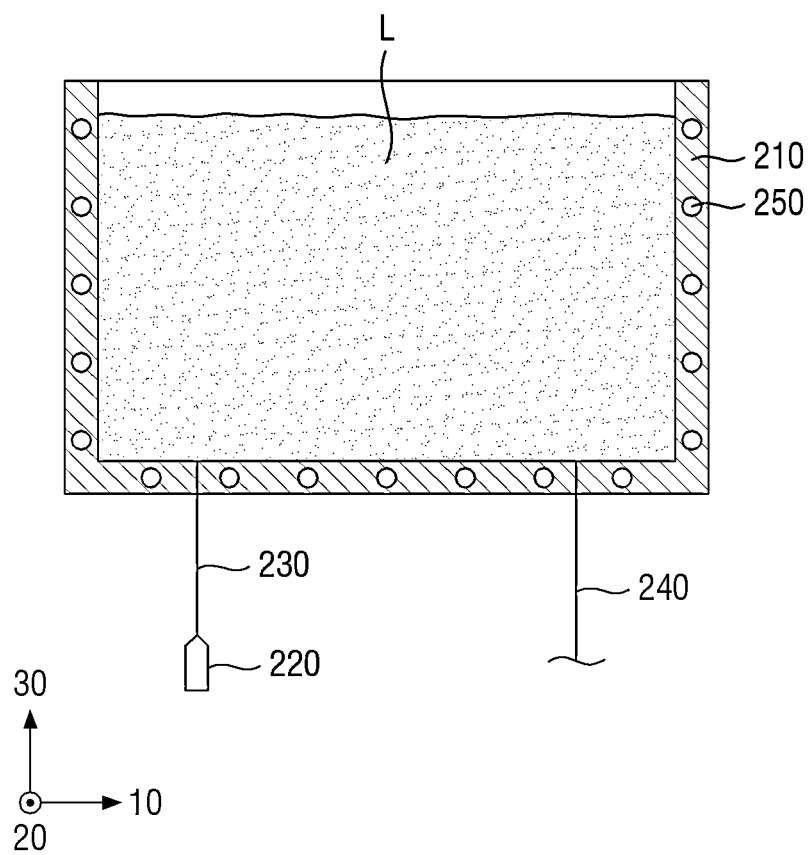
Figure 3B:
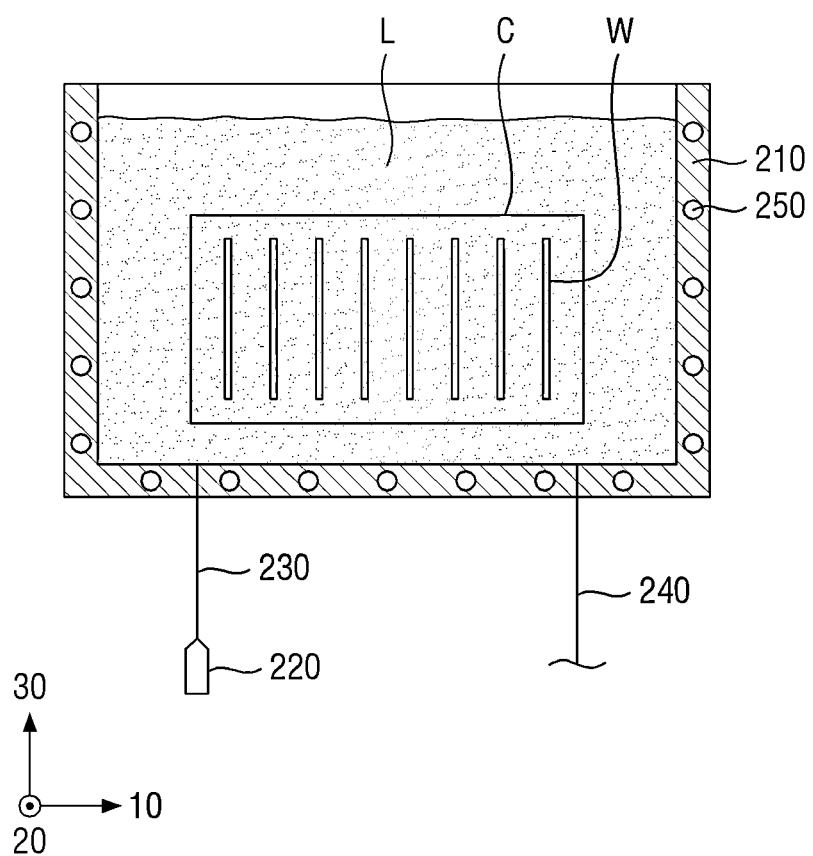

FIGS. 3A and 3B are first and second exemplary schematic views, respectively, illustrating the treatment of multiple substrates by the first substrate treatment apparatus.

Referring to FIGS. 2, 3A, and 3B, a storage container W containing a plurality of substrates W, for example, around 25 to 50 substrates W, may be immersed in the substrate treatment liquid L, which is supplied to the accommodating space 210a of the treatment chamber 210 by the transfer unit 130.

First, as illustrated in FIG. 2, the substrate treatment liquid L is introduced into the accommodating space 210a of the treatment chamber 210 to fill the accommodating space 210a with the substrate treatment liquid L.

Thereafter, as illustrated in FIG. 3A, with a gripping section 130a of the transfer unit 130 holding the storage container C, a driving section (not illustrated) of the transfer unit 130 moves upward along a rail R toward an upper part of the treatment chamber 210.

Thereafter, as illustrated in FIG. 3B, a lifting section 130b of the transfer unit 130 descends and places the storage container C into the accommodating space 210a of the treatment chamber 210. In this case, the multiple substrates W stored in the storage container C may maintain their vertical posture.

Following the sequential steps illustrated in FIGS. 2, 3A, and 3B, the storage container C becomes immersed in the substrate treatment liquid L within the accommodating space 210a of the treatment chamber 210. Then, the substrate treatment liquid L flows into the storage space of the storage container C, allowing the treatment of the multiple substrates W.

If the first substrate treatment apparatus 110 is implemented as batch-type equipment and the second substrate treatment apparatus 120 is implemented as single-type equipment, the second substrate treatment apparatus 120 may perform the drying of each substrate rinsed with the second treatment liquid. For example, the second substrate treatment apparatus 120 may use a spin-drying process or employ a supercritical drying process to dry each substrate.

Figure 4:
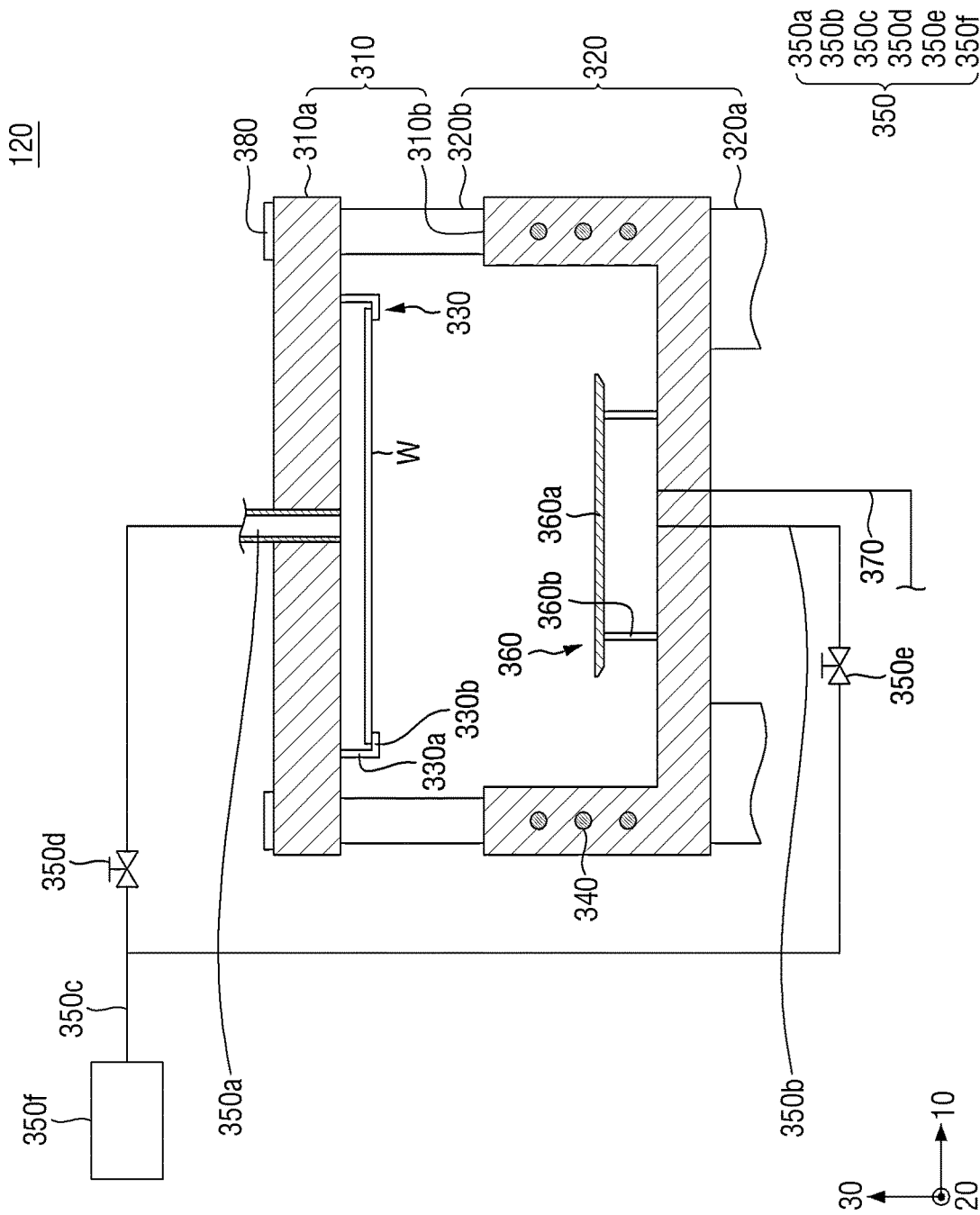
FIG. 4 is a schematic view illustrating the internal configuration of a second substrate treatment apparatus that constitutes the substrate treatment system.

The drying of each substrate via a supercritical drying process will hereinafter be described. FIG. 4 is a schematic view illustrating the internal configuration of a second substrate treatment apparatus that constitutes the substrate treatment system.

Referring to FIG. 4, a second substrate treatment apparatus 120 may include a housing 310, a lifting unit 320, a support unit 330, a second heating member 340, a fluid supply unit 350, a blocking member 360, and an exhaust member 370.

The second substrate treatment apparatus 120 may process a substrate W using a supercritical fluid. For example, the second substrate treatment apparatus 120 may dry the substrate W using carbon dioxide ($CO_2$) as the supercritical fluid.

The housing 310 provides a treatment space where a supercritical drying process takes place. The housing 310 may be formed of a material capable of withstanding pressures higher than a critical pressure.

The housing 310 includes an upper module 310a and a lower module 310b. The lower module 310b is coupled to and provided below the upper module 310a. The combined space created by the upper module 310a and the lower module 310b serves as a substrate treatment space.

The upper module 310a is fixedly installed to an external structure. The lower module 310b is provided to be liftable with respect to the upper module 310a. When the lower module 310b descends and separates from the upper module 310a, the treatment space within the second substrate treatment apparatus 120 is opened. The substrate W may then be introduced into or removed from the interior space of the second substrate treatment apparatus 120.

The substrate W introduced into the second substrate treatment apparatus 120 may be in a state where a cleaning liquid (e.g., DIW) remains. When the lower module 310b rises and adheres to the upper module 310a, the interior treatment space of the second substrate treatment apparatus 120 is sealed. Within the sealed treatment space, the substrate W may be treated using the supercritical fluid. Alternatively, the housing 310 may have a structure where the lower module 310b is fixedly installed, while the upper module 310a is designed to be liftable.

The lifting unit 320 raises the lower module 310b. The lifting unit 320 includes a lifting cylinder 320a and a lifting rod 320b. The lifting cylinder 320a is coupled to the lower module 310b and generates a vertical driving force. During the treatment of the substrate W using the supercritical fluid, the lifting cylinder 320a generates a sufficient driving force to overcome pressures above the critical pressure inside the second substrate treatment apparatus 120 and to seal the second substrate treatment apparatus 120 by adhering the upper module 310a and the lower module 310b. One end of the lifting rod 320b is inserted into the lifting cylinder 320a and extends in a vertical upward direction (or the third direction 30), and the other end of the lifting rod 320b is coupled to the upper module 310a.

When the lifting cylinder 320a generates a driving force, the lifting cylinder 320a and the lifting rod 320b are relatively raised, and the lower module 310b, which is coupled to the lifting cylinder 320a, can be lifted. While the lower module 310b is lifted by the lifting cylinder 320a, the lifting rod 320b guides the lifting direction of the lower module 310b and prevents the upper and lower modules 310a from moving in a horizontal direction (e.g., a first direction 10 or a second direction 20), thereby preventing the upper and lower modules 310a from disengaging from their proper positions.

The support unit 330 is positioned in the treatment space of the housing 310 and supports the substrate W. The support unit 330 is coupled to the upper module 310a. The support unit 330 includes vertical portions 330a and a horizontal portion 330b.

The vertical portions 330a extend downward from the upper wall of the housing 310. The vertical portions 330a are installed on the bottom surface of the upper module 310a. The vertical portions 330a further extend beneath the upper module 310a. The ends of the vertical portions 330a are vertically connected to the horizontal portion 330b. The horizontal portion 330b extends inward from the ends of the vertical portions 330a towards the inside of the housing 310. The substrate W is placed on the horizontal portion 330b. The horizontal portion 330b supports the bottom surface of the edge area of the substrate W.

The support unit 330 contacts the edge area of the substrate W, providing support to the entire top surface and most of the bottom surface of the substrate W during treatment with the supercritical fluid. Here, the substrate W may have a patterned top surface and a non-patterned bottom surface.

The support unit 330 is installed on the upper module 310a. The support unit 330 may stably support the substrate W while the lower module 310b is being lifted.

A horizontal adjustment member 380 is installed in the upper module 310a, in which the support unit 330 is installed. The horizontal adjustment member 380 adjusts the level of the upper module 310a. By adjusting the level of the upper module 310a, the horizontal alignment of the substrate W supported by the support unit 330 on the upper module 310a is also controlled. When the upper module 310a is lifted and the lower module 310b is fixedly installed, or when the support unit 330 is installed on the lower module 310b, the horizontal adjustment member 380 may also be installed in the lower module 310b.

The second heating member 340 heats the interior of the second substrate treatment apparatus 120. The second heating member 340 maintains the supercritical fluid in a supercritical state by heating the supercritical fluid supplied to the interior of the second substrate treatment apparatus 120 to a temperature above the critical temperature. When the supercritical fluid is liquefied, the second heating member 340 may reheat the supercritical fluid to revert the supercritical fluid back to the supercritical state. The second heating member 340 is buried within at least one of the walls of the upper module 310a or the lower module 310b. The second heating member 340 receives power from an external source to generate heat. The second heating member 340 may be provided, for example, as a heater.

The fluid supply unit 350 supplies fluid to the second substrate treatment apparatus 120. The supplied fluid may be the supercritical fluid. In some embodiments, the supercritical fluid may be carbon dioxide.

The fluid supply unit 350 may include an upper fluid supply section 350a, a lower fluid supply section 350b, a supply pipe 350c, valves 350d and 350e, and a supercritical fluid storage section 350f.

The upper fluid supply section 350a directly supplies the supercritical fluid to the top surface of the substrate W. The upper fluid supply section 350a is connected to the upper module 310a. The upper fluid supply unit 350a is connected to a part of the upper module 310a that is directed towards the central top surface of the substrate W.

The lower fluid supply section 350b supplies the supercritical fluid to the bottom surface of the substrate W. The lower fluid supply section 350b is connected to the lower module 310b. The lower fluid supply section 350b is connected to a part of the lower module 310b that is directed towards the central bottom surface of the substrate W.

The supercritical fluid sprayed from the upper and lower fluid supply sections 350a and 350b reaches the central area of the substrate W and spreads towards the edge area, providing a uniform distribution over the entire surface of the substrate W.

The supply pipe 350c is connected to both the upper and lower fluid supply sections 350a and 350b. The supply pipe 350c receives the supercritical fluid from a separate supercritical fluid storage section 350f, and supplies the supercritical fluid to the upper and lower fluid supply sections 350a and 350b.

The valves 350d and 350e are installed in the supply pipe 350c. Multiple valves 350d and 350e may be provided in the supply line. Each of the valves 350d and 350e controls the flow rate of the supercritical fluid supplied to the upper and lower fluid supply sections 350a and 350b. Although not specifically illustrated in FIG. 3, the valves 350d and 350e may also control the flow rate of the supercritical fluid supplied into the housing 310 by a control device.

The fluid supply unit 350 first supplies the supercritical fluid to the lower fluid supply section 350b. Thereafter, the fluid supply unit 350 may supply the supercritical fluid to the upper fluid supply section 350a. A supercritical drying process may be conducted when the interior of the second substrate treatment apparatus 120 is not yet at the critical pressure. If the interior of the second substrate treatment apparatus 120 is below the critical pressure, the supercritical fluid supplied to the interior of the second substrate treatment apparatus 120 may liquefy. When the supercritical fluid is liquefied, the supercritical fluid may fall onto the substrate W due to gravity, potentially causing damage to the substrate W.

Therefore, the lower fluid supply section 350b first supplies the supercritical fluid. After the supercritical fluid is supplied to the second substrate treatment apparatus 120, the internal pressure of the second substrate treatment apparatus 120 reaches the critical pressure. Once the internal pressure of the second substrate treatment apparatus 120 reaches the critical pressure, the upper fluid supply section 350a supplies supercritical fluid. By supplying supercritical fluid from the lower fluid supply section 350b before from the upper fluid supply section 350a, the supercritical fluid can be prevented from liquefying and falling onto the substrate W.

The blocking member 360 prevents the supercritical fluid supplied from the fluid supply unit 350 from being sprayed directly on the bottom surface of each of the substrate W. The blocking member 360 includes a blocking plate 360a and support elements 360b.

The blocking plate 360a is positioned inside the housing 310, i.e., within the treatment space. The blocking plate 360a is placed between the support unit 330 and the lower fluid supply section 350b. The blocking plate 360a has a shape corresponding to the shape of the substrate W. For example, the blocking plate 360a may have a circular plate shape. The radius of the blocking plate 360a may be similar to or larger than that of the substrate W. By placing the blocking plate 360a on the bottom surface of the substrate W supported by the support unit 330, the supercritical fluid supplied through the lower fluid supply section 350b is prevented from being directly sprayed on the lower surface of the substrate W. When the radius of the blocking plate 360a is similar to or larger than the radius of the substrate W, the blocking plate 360a can completely block the supercritical fluid from directly impinging on the substrate W.

On the contrary, the radius of the blocking plate 360a may be smaller than the radius of the substrate W. In this case, the blocking plate 360a prevents the supercritical fluid from directly impinging on the substrate W. Additionally, the blocking plate 360a minimizes the flow rate of the supercritical fluid, allowing the supercritical fluid to reach the substrate W relatively easily. When the radius of the blocking plate 360a is smaller than the radius of the substrate W, the supercritical drying process for the substrate W can be effectively conducted.

The support elements 360b support the blocking plate 360a. The support elements 360b support the rear surface of the blocking plate 360a. The support elements 360b are installed on the lower wall of the housing 310 in the vertical direction (or the third direction 30). The support elements 360b and the blocking plate 360a may be positioned on the support elements 360b by the gravity of the blocking plate 360a without any particular coupling.

On the other hand, the support elements 360b and the blocking plate 360a may be coupled using coupling means such as nuts or bolts. Alternatively, the support elements 360b and the blocking plate 360a may be integrally formed.

The exhaust member 370 discharges the supercritical fluid from the second substrate treatment apparatus 120. The exhaust member 370 may be connected to an exhaust line for discharging the supercritical fluid. Although not specifically illustrated in FIG. 3, a valve may be installed on the exhaust member 370 to control the flow rate of the supercritical fluid discharged to the exhaust line.

The supercritical fluid discharged through the exhaust line may be released into the atmosphere. Alternatively, the supercritical fluid may be supplied to a supercritical fluid regeneration system. The exhaust member 370 may be coupled to the lower module 310b.

At a later stage of the substrate treatment process using the supercritical fluid, the internal pressure of the second substrate treatment apparatus 120 is depressurized below the critical pressure as the supercritical fluid is discharged. The liquefied supercritical fluid may be discharged through the exhaust member 370, which is formed in the lower module 310b due to gravity.

Referring again to FIG. 1, the substrate inspection apparatus 140 inspects substrates W. The substrate inspection apparatus 140 may inspect the substrates W using a vision system including a camera module and an illumination module.

Figure 5:
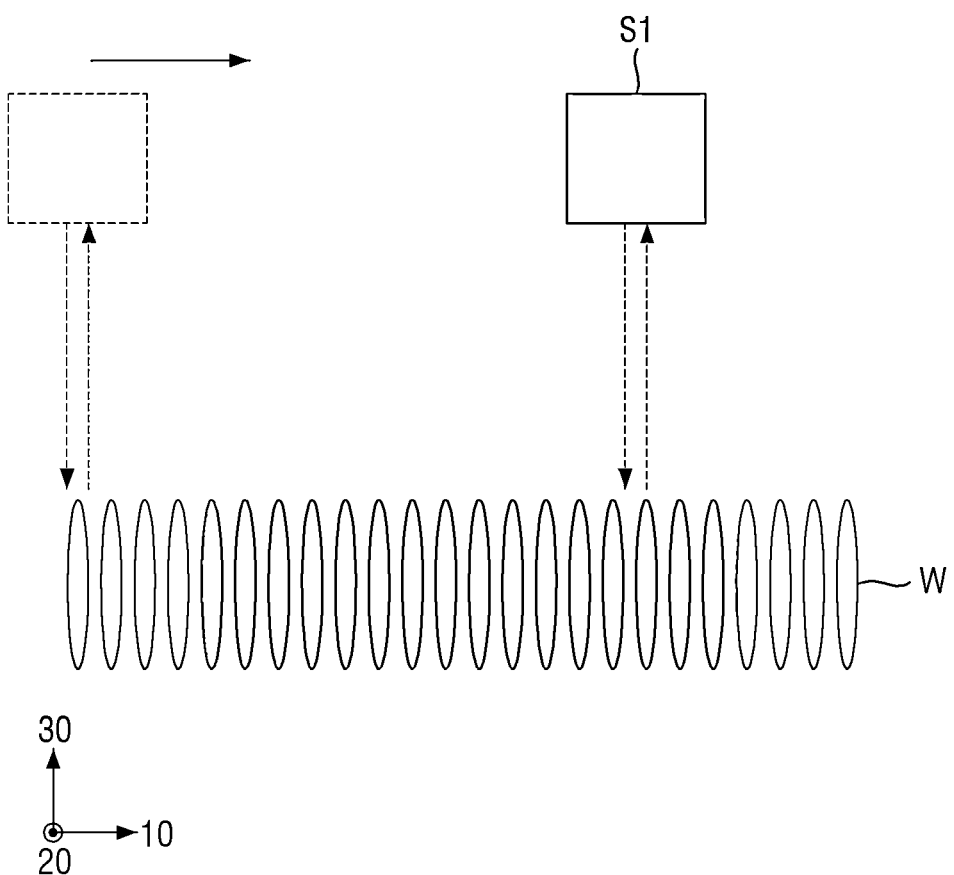
FIG. 5 is a schematic view illustrating the inspection of substrates using a distance measurement sensor.

As mentioned earlier, conventionally, a distance measurement sensor Si is used to inspect the substrates W. According to this type of method, only the presence of the substrates W may be determined based on the distances measured by the distance measurement sensor Si, and any abnormalities in the state of the substrates W may not be able to be discerned. Additionally, since multiple substrates W stored in the storage container C are sequentially inspected, it may take a long period of time to determine the presence of the substrates W in their entirety. FIG. 5 is a schematic view illustrating the inspection of substrates using a distance measurement sensor.

As the substrates W can be inspected using a vision system that includes a camera module and illumination module, it is possible to identify not only the presence of the substrates W, but also the quantity and any abnormal conditions. Additionally, it is possible to reduce the inspection time for the substrates W.

Figure 6:
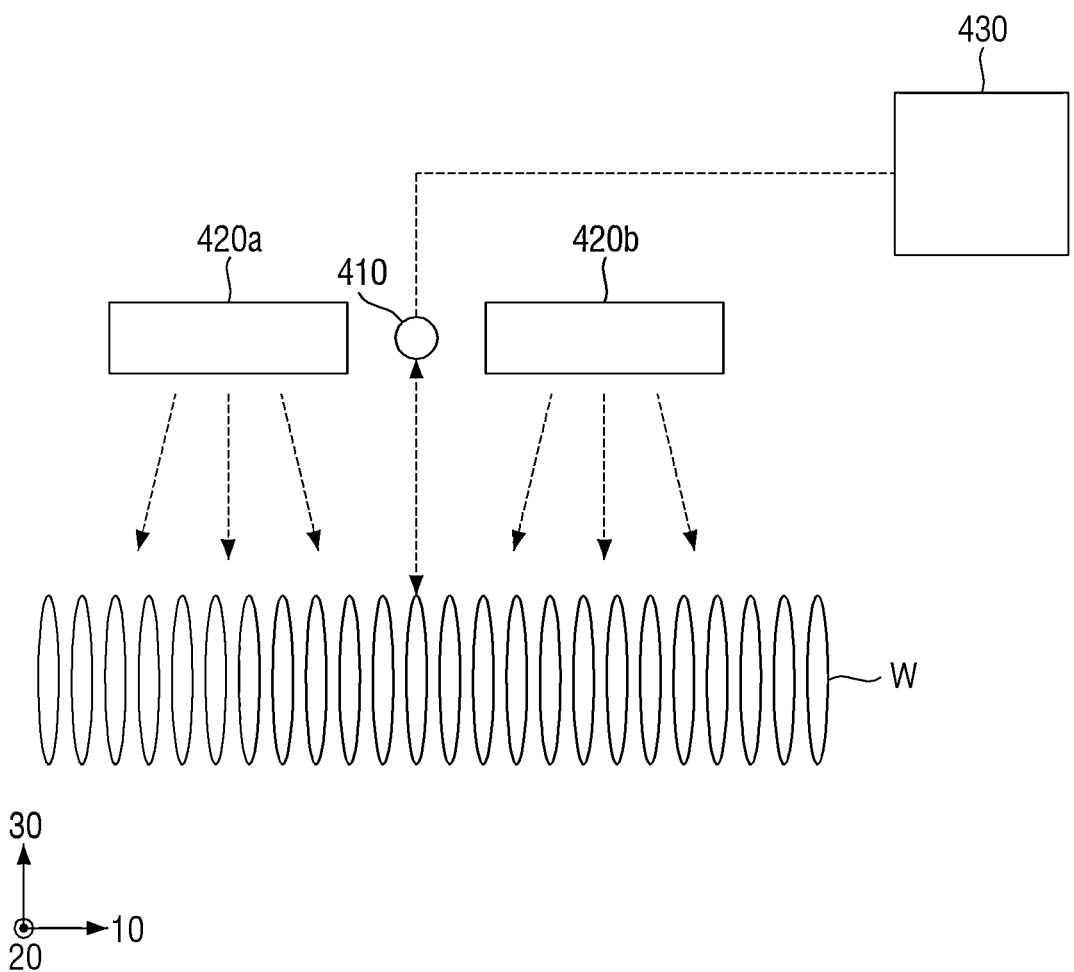
FIGS. 6 and 7 are first and second exemplary schematic views, respectively, illustrating the inspection of substrates using a vision system.

FIG. 6 is a first exemplary schematic view illustrating the inspection of substrates using a vision system.

Referring to FIG. 6, the substrate inspection apparatus 140 may be configured to include a vision system, particularly, a camera module 410, illumination modules 420a and 420b, and a control module 430.

The camera module 410 acquires image information on multiple substrates W. When light output by the illumination modules 420a and 420b is reflected from the multiple substrates W, the camera module 410 may utilize the reflected light to acquire the image information on the substrates W. In other words, the camera module 410 may capture images of the substrates W by measuring the reflected light on the surfaces of the substrates W in a manner illustrated in FIG. 6.

The illumination modules 420a and 420b are for illuminating the substrates W. The illumination modules 420a and 420b may be placed on both sides of the camera module 410. For example, the illumination modules 420a and 420b may be provided as light ultraviolet visible (LUV) illumination modules.

The illumination modules 420a and 420b may illuminate all the substrates W stored in the storage container C to effectively capture sharp image information on the substrates W. In the example of FIG. 6, there are two illumination modules 420a and 420b, but alternatively, the substrate inspection device 140 may include three or more illumination modules.

Figure 7:
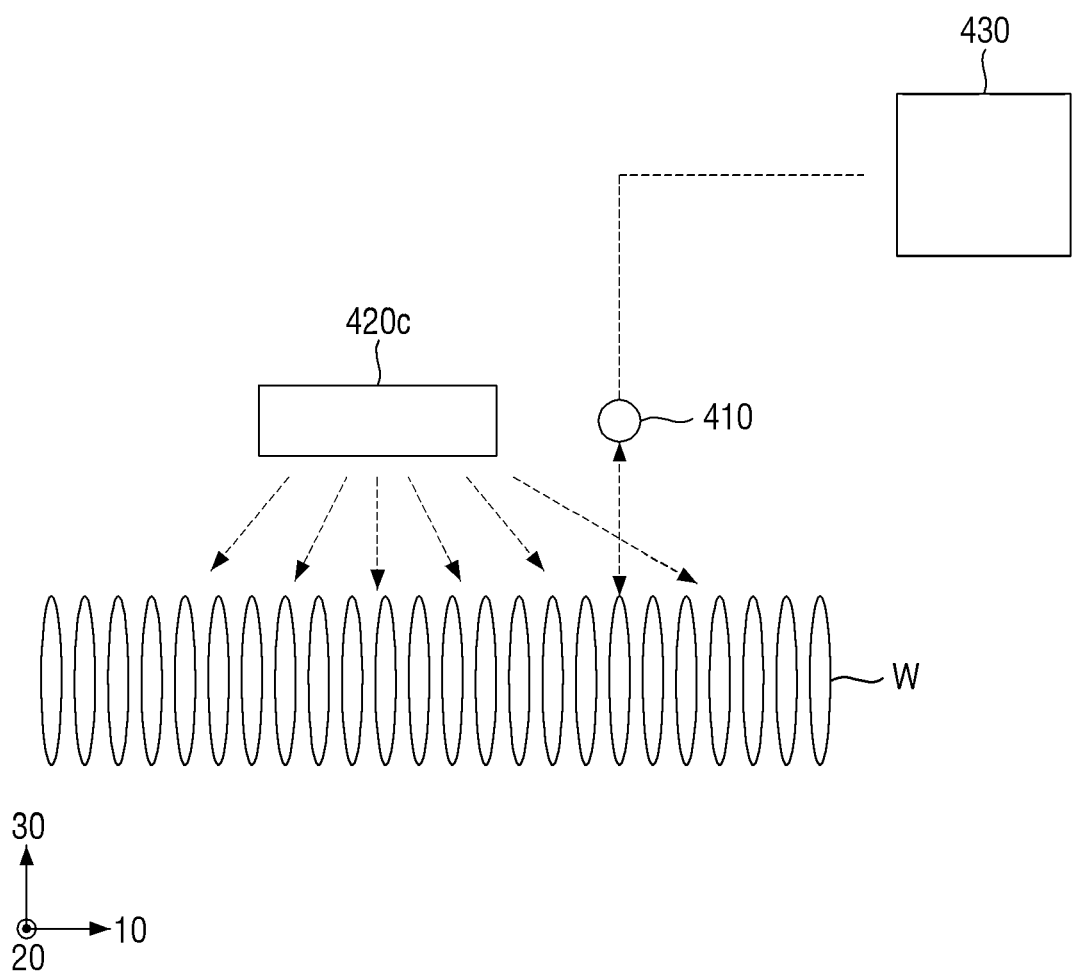

Alternatively, the substrate inspection device 140 may include only one illumination module. In this case, an illumination module 420c may be placed on the left side of the camera module 410, as illustrated in FIG. 7, but the present disclosure is not limited thereto. Alternatively, the illumination module 420c may be placed on the right side of the camera module 410. FIG. 7 is a second exemplary schematic view illustrating the inspection of substrates using the vision system.

When multiple illumination modules are provided within the substrate inspection apparatus 140, the multiple illumination modules may be arranged in a direction parallel to the array direction of the substrates W to obtain sharp image information on all the substrates W. For example, if multiple substrates W are arranged in the first direction 10, the multiple illumination modules may also be arranged in the first direction 10.

Figure 8:
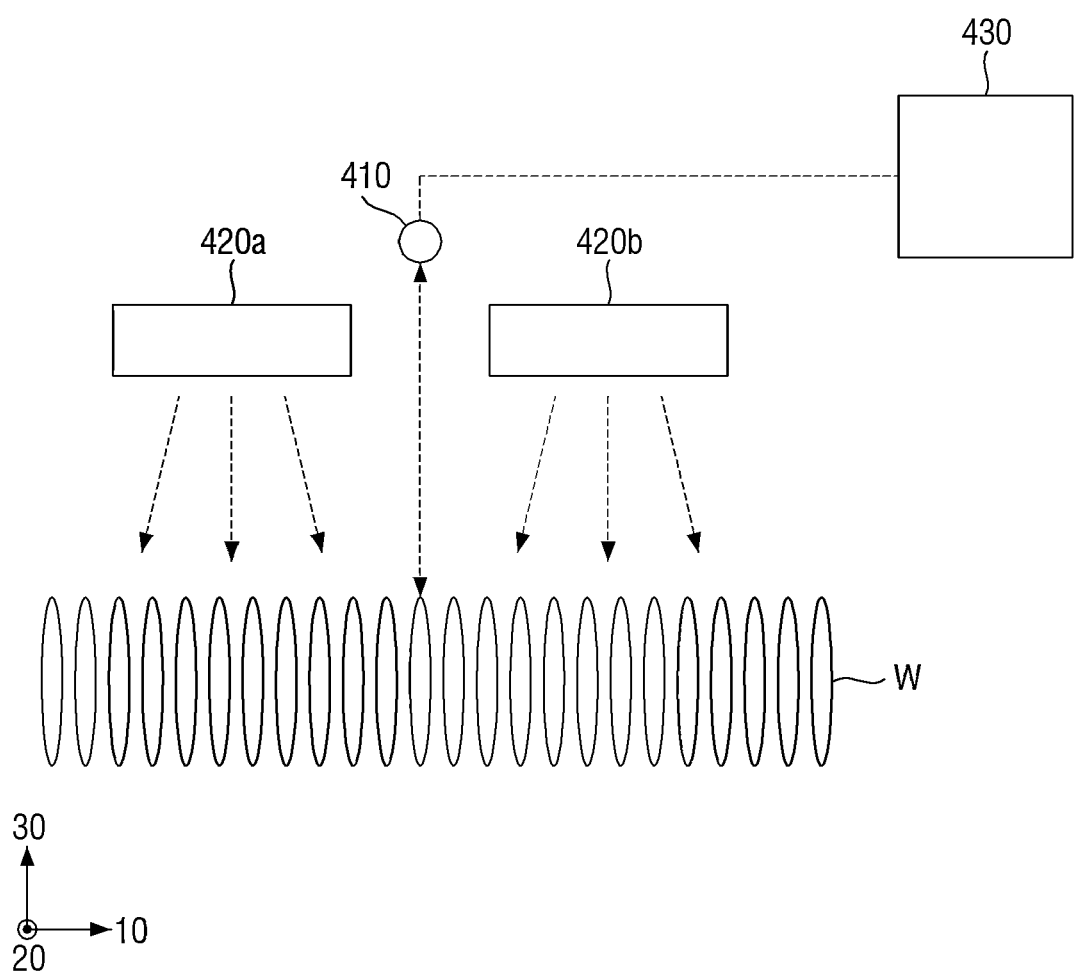
FIGS. 8 and 9 are first and second exemplary schematic views, respectively, illustrating the arrangement of illumination modules that constitute the substrate inspection apparatus.
Figure 9:
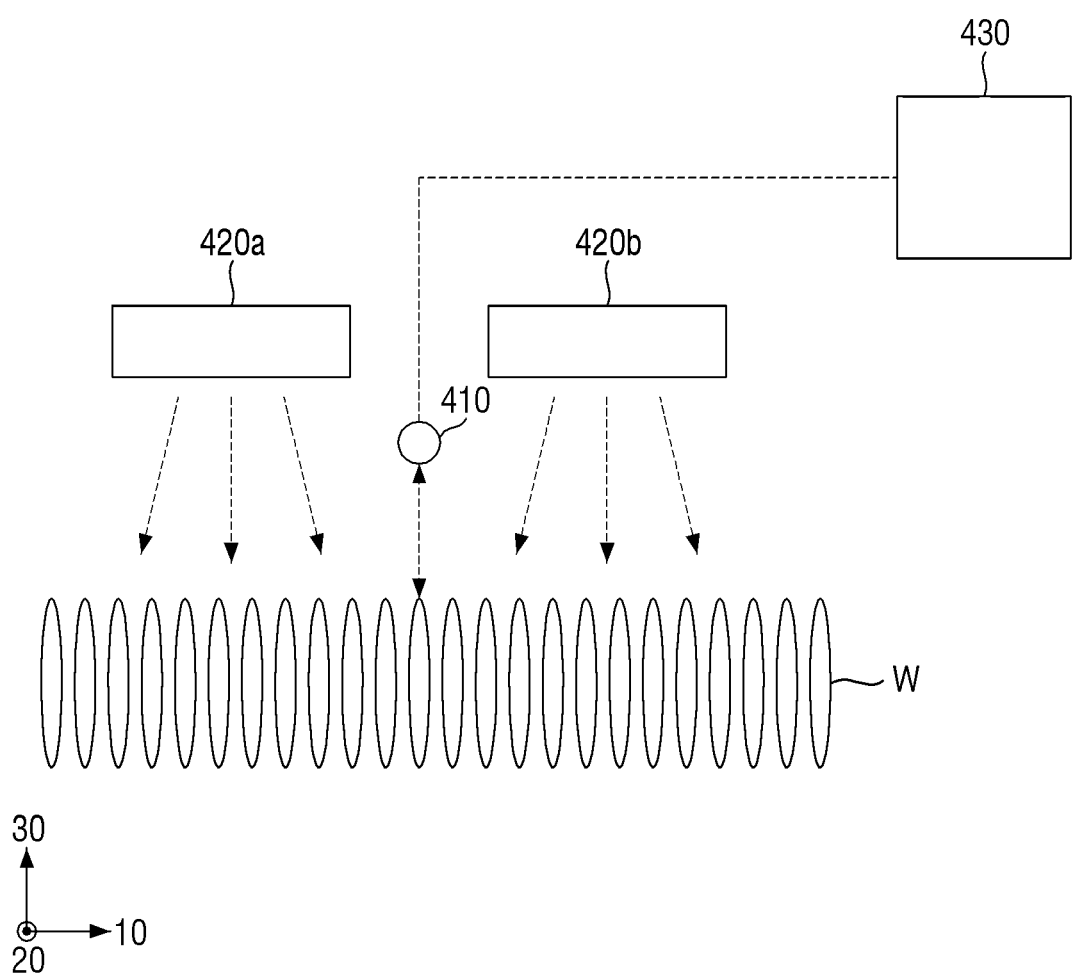

The illumination modules 420a and 420b may be positioned on the same line as the camera module 410, but the present disclosure is not limited thereto. The illumination modules 420a and 420b may not necessarily be positioned on the same line as the camera module 410 as long as sharp image information on all the substrates W can be obtained. For example, as illustrated in FIG. 8, the illumination modules 420a and 420b may be positioned closer to the substrates W than the camera module 410. In another example, as illustrated in FIG. 9, the illumination modules 420a and 420b may be placed farther away from the substrates W than the camera module 410. FIGS. 8 and 9 are first and second exemplary schematic views, respectively, illustrating the arrangement of illumination modules that constitute the substrate inspection apparatus.

FIGS. 8 and 9 illustrate two illumination modules, i.e., the illumination modules 420a and 420b, are positioned on the same line, but the present disclosure is not limited thereto. That is, the illumination modules 420a and 420b may not necessarily be positioned on the same line. For example, when multiple illumination modules with different illuminances are used, the illumination module with a higher illuminance may be placed farther away from the substrates W compared to the illumination module with a lower illuminance.

Referring again to FIG. 6, the control module 430 may inspect the substrates W stored in the storage container C based on the image information acquired by the camera module 410. The control module 430 may determine the presence of the substrates W, the number of substrates W, and abnormalities in the state of the substrates W based on the image information.

Figure 10:
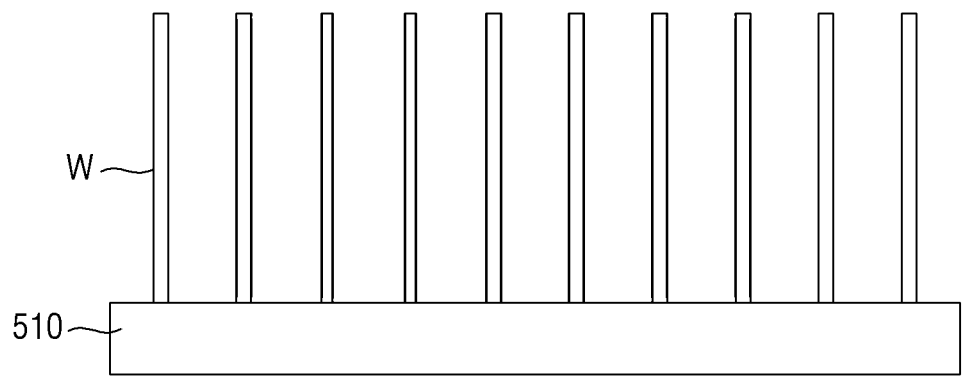
FIGS. 10 and 11 are first and second exemplary schematic views, respectively, illustrating the inspection of the presence of substrates as performed in a substrate inspection method.
Figure 10:
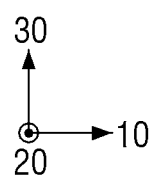
Figure 11:
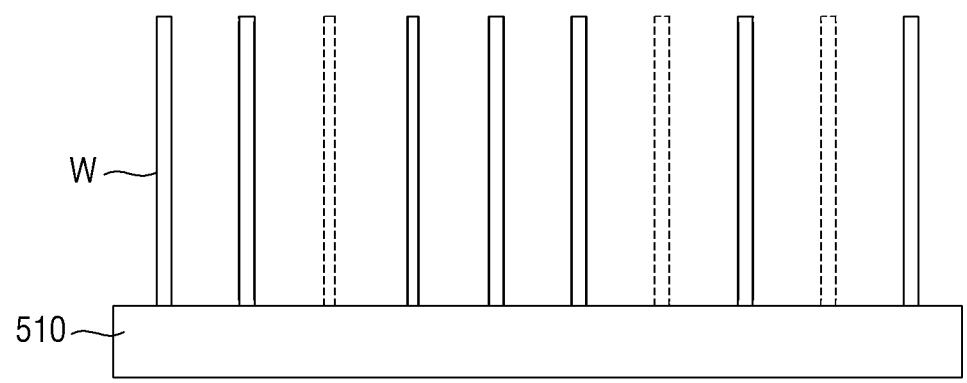
Figure 11:
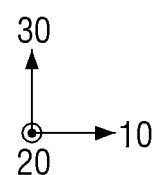

For example, ten substrates W may be positioned on a chuck within the storage container C. The control module 430 may determine the presence of the substrates W stored in the storage container C based on the image information acquired by the camera module 410. FIG. 10 illustrates a normal case, and FIG. 11 illustrates an abnormal case. Here, the normal case refers to a case where all the ten substrates W are properly positioned on the chuck 510, and the abnormal case refers to a case where some of the ten substrates W are not present on the chuck 510. Referring to FIG. 11, the third, seventh, and ninth substrates W from the left are not present on the chuck 510. FIGS. 10 and 11 are first and second exemplary schematic views illustrating the inspection of the presence of substrates as performed in a substrate inspection method.

Figure 12:
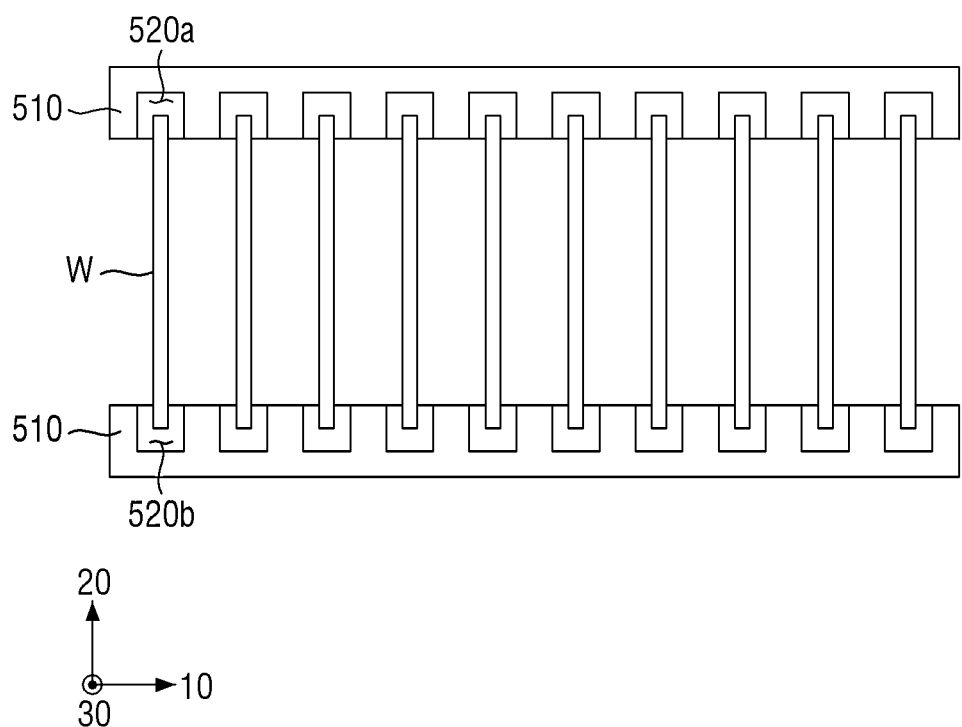
FIGS. 12 and 13 are first and second exemplary views, respectively, illustrating an unsafe inspection as performed in the substrate inspection method.
Figure 13:
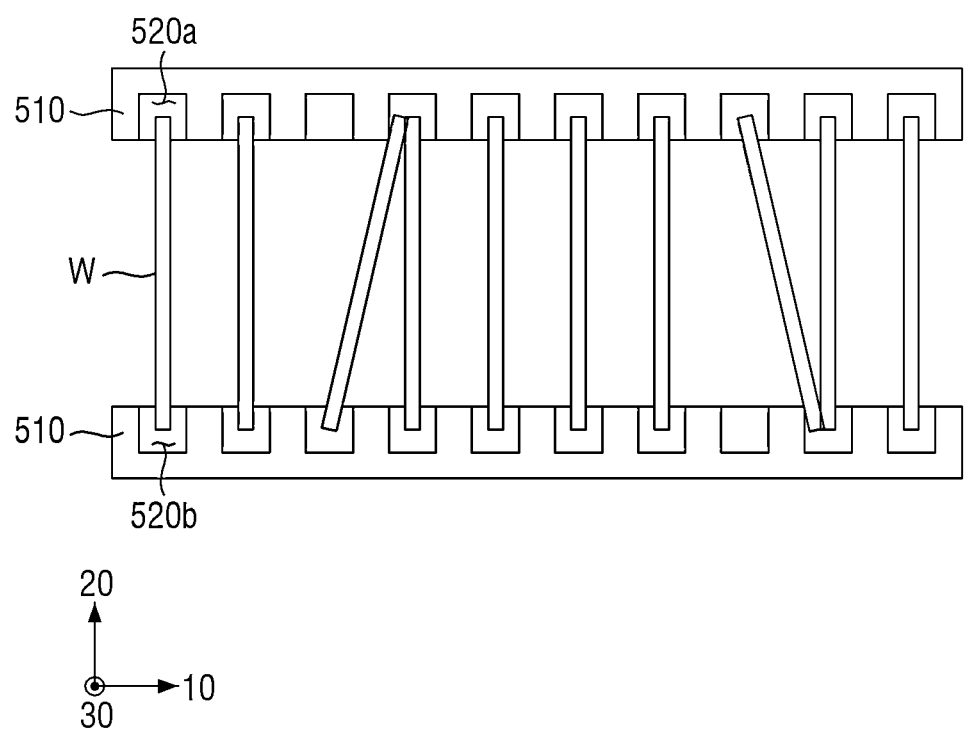

The control module 430 may also determine the safety of each of the substrates W stored in the storage container C based on the image information acquired by the camera module 410. In a safety inspection, the control module 430 may determine the safety of each of the substrates W by checking whether each of the substrates W is securely inserted into slot grooves 520a and 520b that form a pair on the chuck 510. FIG. 12 illustrates a case where the substrates W are determined to be safe, and FIG. 13 illustrates a case where the substrates W are determined to be unsafe. The safe case refers to a case where all the ten substrates W are properly inserted into their respective pairs of slot grooves 520a and 520b, while the unsafe case refers to a case where some of the ten substrates W are not properly inserted into their respective pairs of slot grooves 520a and 520b. Referring to FIG. 13, each of the third and eighth substrates W from the left are inserted into slot grooves 520a and 520b that do not form a pair. FIGS. 12 and 13 are first and second exemplary views, respectively, illustrating an unsafe inspection as performed in the substrate inspection method.

Figure 14:
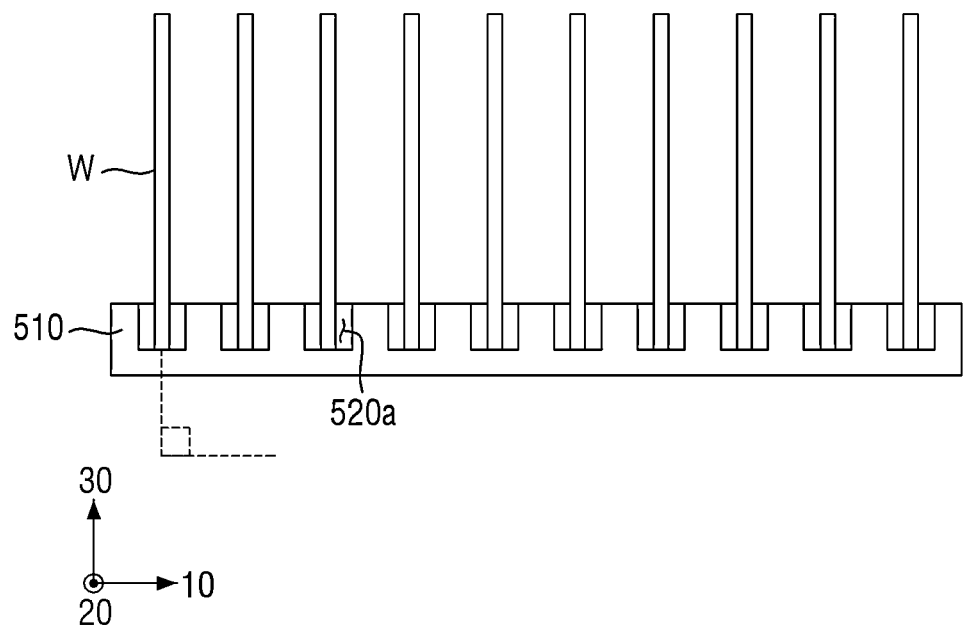
FIGS. 14 and 15 are first and second exemplary schematic views, respectively, illustrating an inclination inspection as performed in the substrate inspection method.
Figure 15:
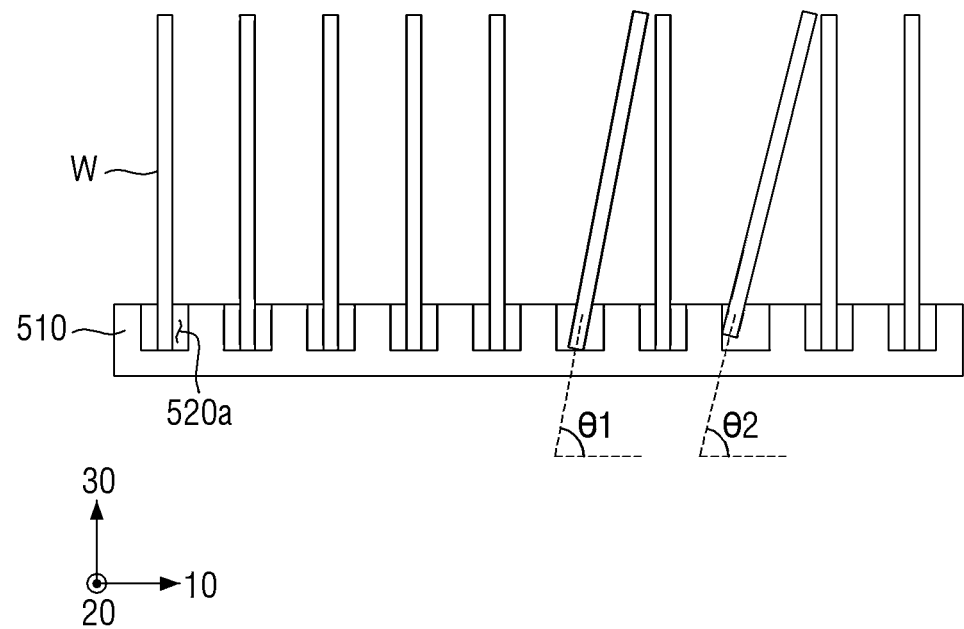

The control module 430 may also determine the inclination of each of the substrate W stored in the storage container C based on the image information acquired by the camera module 410. In an inclination inspection, the control module 430 may determine the vertical standing status of the substrates W by checking whether the substrates W have moved out of their respective pairs of slot grooves 520a and 520b and have tilted within the chuck 510. FIG. 14 illustrates a case where no inclination is detected, and FIG. 15 illustrates a case where inclination is detected. Here, the case with no inclination refers to a case where all the ten substrates W are properly inserted into their respective pairs of slot grooves 520a and 520b in the vertical direction (or the third direction 30) with respect to the length direction of the chuck 510 (or the first direction 10), while the case with inclination refers to a case where some of the ten substrates W are not properly inserted into their respective pairs of slot grooves 520a and 520b in the vertical direction (or the third direction 30) with respect to the length direction of the chuck 510. Referring to FIG. 15, the sixth and eighth substrates W from the left are tilted at angles $\theta_1$ and $\theta_2$ with respect to the length direction of the chuck 510, where $\theta_1$ and $\theta_2$ are values greater than 0 degrees and less than 90 degrees, i.e., $0°<\theta_1<90°$ and $0°<\theta_2<90°$. FIGS. 14 and 15 are first and second exemplary schematic views, respectively, illustrating an inclination inspection as performed in the substrate inspection method.

Figure 16:
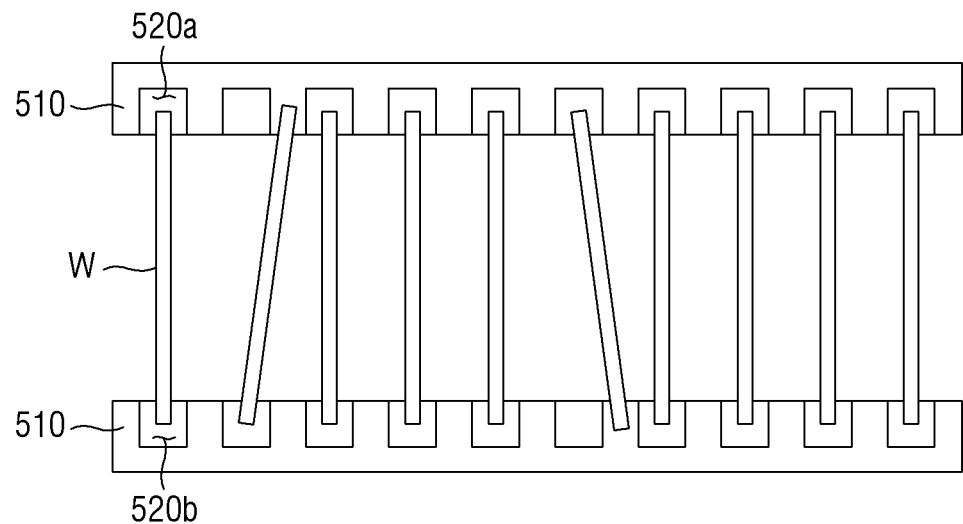
FIG. 16 is a third exemplary schematic view illustrating the inclination inspection as performed in the substrate inspection method.
Figure 16:
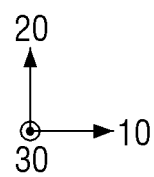

The control module 430 may determine that the substrates W are inclined if they are not inserted into at least one of their respective pairs of slot grooves 520a and/or 520b on both sides. FIG. 16 illustrates a case where the second and sixth substrates W from the left are not inserted into one of their respective pairs of slot grooves 520a or 520b. Specifically, the second substrate W from the left is not inserted in its designated slot groove 520a, and the sixth substrate W from the left is not inserted in its designated slot groove 520b. FIG. 16 is a third exemplary schematic view illustrating the inclination inspection as performed in the substrate inspection method.

Figure 17:
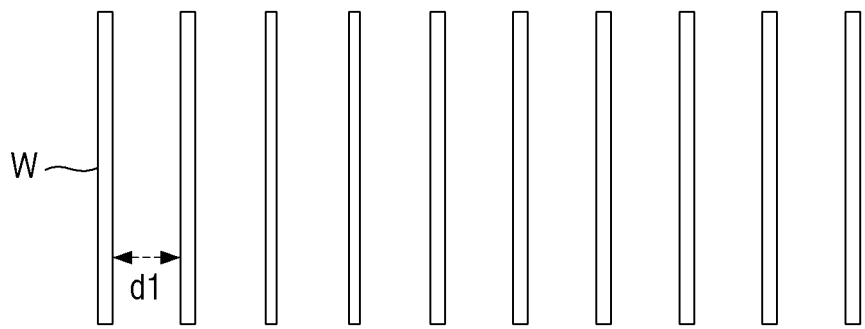
FIGS. 17 and 18 are fourth and fifth exemplary schematic views, respectively, illustrating the inclination inspection as performed in the substrate inspection method.
Figure 17:
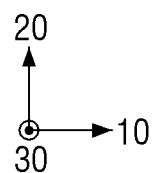
Figure 18:
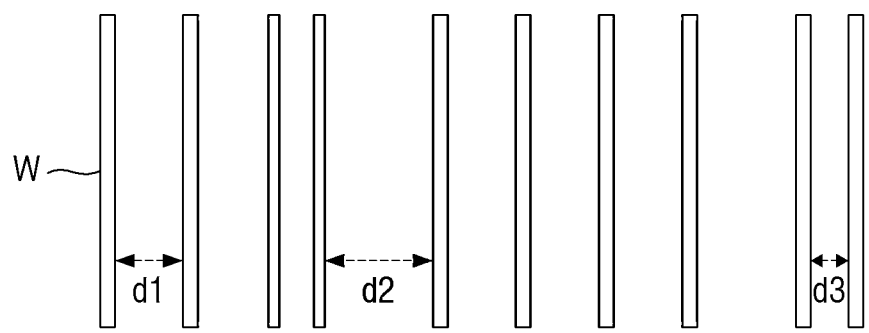
Figure 18:
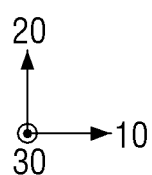

The control module 430 may determine the inclination of the substrates W based on the spacing between the substrates W. FIG. 17 illustrates a case where no inclination is detected, and FIG. 18 illustrates a case where inclination is detected. In the case with no inclination, all the ten substrates W are uniformly spaced by a distance $d_1$, while in the case with inclination, some of the ten substrates W are not uniformly spaced by different distances $d_2$ and $d_3$. Referring to FIG. 18, the fourth and ninth substrates W from the left are spaced from the fifth and tenth substrates W, respectively, from the left by the distances $d_2$ and $d_3$, respectively, and the distances $d_2$ and $d_3$ may be different from the distance $d_1$ (i.e., $d_2 \neq d_1$ and $d_3 \neq d_1$). FIGS. 17 and 18 are fourth and fifth exemplary schematic views, respectively, illustrating the inclination inspection as performed in the substrate inspection method.

The control module 430 may include a process controller, which executes the control of the substrate inspection apparatus 140 using a microprocessor (or computer), a user interface, which includes a keyboard for command input and other operations to manage the substrate inspection apparatus 140 or a display to visualize and display the operating status of the substrate inspection apparatus 140, and a memory unit, which stores a control program running on the process controller to execute processes in the substrate inspection apparatus 140 under the control of the process controller and various programs (i.e., processing recipes) for each component of the substrate inspection apparatus 140 to perform processing based on various data and processing conditions. The user interface and the memory unit may be connected to the process controller. The processing recipes may be stored in a memory medium of the memory unit, and the memory medium may be a hard disk, a removable disk such as a CD-ROM or a DVD, or a semiconductor memory such as a flash memory.

The control module 430 may determine various types of abnormalities in the status of multiple substrates W based on the image information acquired by the camera module 410. An image processing algorithm for inspecting such status abnormalities in substrates W will hereinafter be described.

Figure 19:
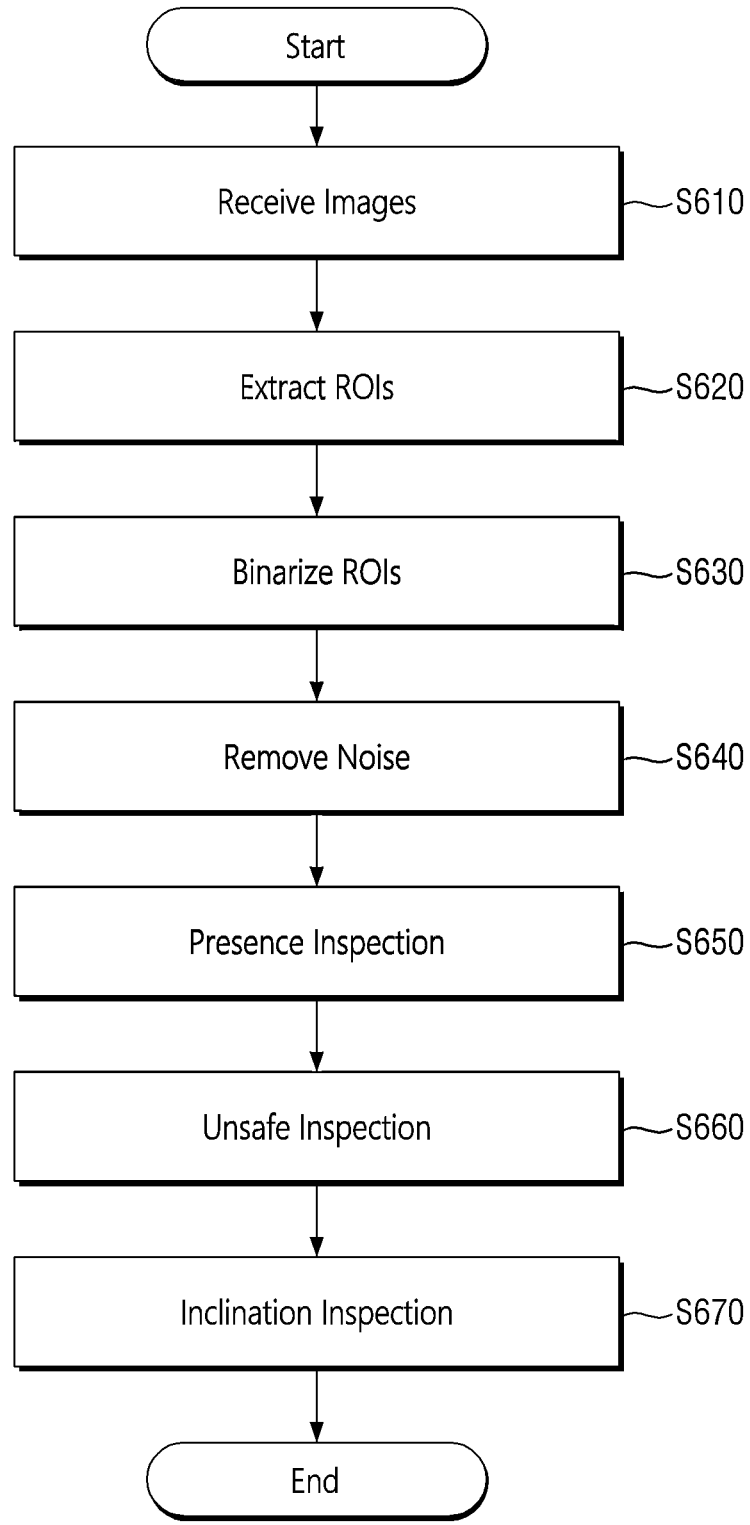
FIG. 19 is a flowchart illustrating a substrate inspection method of a substrate inspection apparatus.

FIG. 19 is a flowchart illustrating a substrate inspection method of a substrate inspection apparatus.

Referring to FIGS. 6 and 19, first, when the illumination modules 420a and 420b illuminate multiple substrates W, the camera module 410 captures reflected light areas on the surfaces of the substrates W to obtain image information on the substrates W (S610).

Thereafter, the control module 430 receives the image information from the camera module 410 and extracts regions of interest (ROIs) from the received image information (S620). The control module 430 may extract the reflected light areas as the ROIs.

Thereafter, the control module 430 binarizes images related to the ROIs and detects binarized regions as binary large objects (BLOBs) (S630).

Thereafter, the control module 430 keeps BLOBs related to reflected light from the substrates W and removes the other BLOBs. In other words, the control module 430 performs noise reduction (S640). Also, in this noise reduction step, the control module 430 connects and merges the notch areas of the substrates W.

Thereafter, the control module 430 determines the presence of the substrates W based on the number of BLOBs (S650). Additionally, the control module 430 calculates the long-axis length of each BLOB and identifies the substrates W as unsafe if there are outliers in the long-axis length of each BLOB (S660). Furthermore, the control module 430 detects inclination if there are significant differences in the distances between the BLOBs (S670).

The transfer unit 130 may transport the substrates W from batch-type equipment to single-type equipment, and the substrate inspection apparatus 140 may inspect the multiple substrates W when the transfer unit 130 transports the storage container C. In this case, the first substrate treatment apparatus 110 may be implemented as batch-type equipment, and the second substrate treatment apparatus 120 may be implemented as single-type equipment. If the first substrate treatment apparatus 110 is batch-type equipment, the first substrate treatment apparatus 100 may be an apparatus that rinses the substrates W with the second treatment liquid (e.g., a rinse solution). Alternatively, the first substrate treatment apparatus 110 may be an apparatus that etches the substrates W with the first treatment liquid (e.g., chemicals) and then rinsing the substrates W. On the other hand, if the second substrate treatment apparatus 120 is implemented as single-type equipment, the second substrate treatment apparatus 120 may be an apparatus that dries the substrate W using a spin-drying process. Alternatively, the second substrate treatment apparatus 120 may be an apparatus that dries the substrate W using a supercritical drying process. Additionally, the substrate inspection apparatus 140 may perform various inspections on the multiple substrates W, such as presence inspection, quantity inspection, unsafe inspection, and inclination inspection.

Alternatively, the transfer unit 130 may transport the substrates W from batch-type equipment to batch-type equipment, and the substrate inspection apparatus 140 may still inspect the multiple substrates W when the transfer unit 130 transports the storage container C. When the first and second substrate treatment apparatuses 110 and 120 are both implemented as batch-type equipment, the first substrate treatment apparatus 100 may be an apparatus that rinses the substrates W with the first treatment liquid, and the second substrate treatment apparatus 120 may be an apparatus that rinses the substrates with the second treatment liquid. Additionally, the substrate inspection apparatus 140 may still perform various inspections on the multiple substrates W, such as presence inspection, quantity inspection, unsafe inspection, and inclination inspection.

Alternatively, the transfer unit 130 may transport the substrates W from single-type equipment to single-type equipment. In this case, the substrate inspection apparatus 140 may still inspect the substrates W when the transfer unit 130 transports the substrates W. When the transfer unit 130 transports the substrates W from batch-type equipment to single-type equipment, the transfer unit 130 may transport a single substrate W at a time. The substrate inspection apparatus 140 may then perform various inspections, such as presence inspection, unsafe inspection, and inclination inspection, on each single substrate W. When the first and second substrate treatment apparatuses 110 and 120 are both implemented as batch-type equipment, the first substrate treatment apparatus 110 may be an apparatus that rinses each single substrate W with the second treatment liquid, and the second substrate treatment apparatus 120 may be an apparatus that dries each single substrate W using a spin-drying process or a supercritical drying process.

The present disclosure relates to the substrate inspection apparatus 140, which inspects substrates with a vision system including a camera module and an illumination module, and the substrate treatment system 100, which includes the substrate inspection apparatus 140. The substrate inspection apparatus 140 may be provided within a batch-type equipment transfer module.

The substrate inspection apparatus 140 scans substrates W fixed on the arm or chuck of the transfer module using the vision system. The substrate inspection apparatus 140 induces and captures reflected light on the surfaces of the substrates W and performs image processing through image processing algorithms based on the induced and captured reflected light to inspect the status of multiple substrates W (e.g., 50 wafers) stored in the storage container C such as the presence, quantity, safety, and inclination of the substrates W.

Furthermore, when the transfer module moves the substrates W in a batch, the substrate inspection apparatus 140 utilizes the vision system to inspect the status of each substrate W in each slot within the storage container C. In this manner, any abnormalities that may occur in the status of the substrates W during transfer can be detected. For example, the substrate inspection apparatus 140 may detect abnormalities in the status of the substrates W during the transfer of the substrates W from batch-type equipment to single-type equipment. As all the substrates W within the storage container C can be inspected with a single image capturing process, inspection time can be reduced.

Embodiments of the present disclosure have been described above with reference to the accompanying drawings, but the present disclosure is not limited thereto and may be implemented in various different forms. It will be understood that the present disclosure can be implemented in other specific forms without changing the technical spirit or gist of the present disclosure. Therefore, it should be understood that the embodiments set forth herein are illustrative in all respects and not limiting.

What is claimed is:

1. A substrate treatment system comprising:
   a first substrate treatment apparatus;
   a second substrate treatment apparatus;
   a transfer unit transporting a container with a plurality of substrates accommodated therein from the first substrate treatment apparatus to the second substrate treatment apparatus; and
   a substrate inspection apparatus inspecting the substrates, wherein the substrate inspection apparatus includes an illumination module, which illuminates in a direction where the substrates are located, a camera module, which acquires images related to the substrates when the substrates are illuminated, and a control module, which inspects the substrates based on the images.

2. The substrate treatment system of claim 1, wherein the control module determines at least one of the presence, quantity, installation status, and inclination of the substrates based on a result of the inspection of the substrates.

3. The substrate treatment system of claim 2, wherein the control module determines the presence of the substrates based on whether the substrates are positioned on a chuck within the container.

4. The substrate treatment system of claim 2, wherein the control module determines the installation status of the substrates based on whether the substrates are inserted into their respective pairs of slot grooves within the container that face the substrates.

5. The substrate treatment system of claim 2, wherein the control module determines the inclination of the substrates based on whether the substrates are inserted into both of their respective pairs of slot grooves within the container.

6. The substrate treatment system of claim 2, wherein the control module determines the inclination of the substrates based on spacings between the substrates within the container.

7. The substrate treatment system of claim 2, wherein the control module determines the inclination of the substrates based on angles of width directions of the substrates with respect to a length direction of a chuck.

8. The substrate treatment system of claim 1, wherein the control module processes the images by extracting regions of interest (ROIs) from the images, binarizing the ROIs, classifying the binarized ROIs into binary large objects (BLOBs), and excluding all the BLOBs except for those associated with reflected light.

9. The substrate treatment system of claim 8, wherein the control module inspects the substrates based on a number of BLOBs.

10. The substrate treatment system of claim 8, wherein the control module inspects the substrates based on a result of calculation of long-axis lengths of the BLOBs.

11. The substrate treatment system of claim 8, wherein the control module inspects the substrates based on a result of measurement of distances between the BLOBs.

12. The substrate treatment system of claim 1, wherein a plurality of illumination modules are provided on either side of the camera module.

13. The substrate treatment system of claim 1, wherein the camera module acquires the image based on reflected light from the surfaces of the plurality of substrates, which is caused by the illumination module.

14. The substance treatment system of claim 1, wherein the substrate inspection apparatus inspects the substrates when the transfer unit transports the container.

15. The substrate treatment system of claim 1, wherein
   the first substrate treatment apparatus is batch-type equipment, and
   the second substrate treatment apparatus is single-type equipment.

16. The substrate treatment system of claim 1, wherein
   the first substrate treatment apparatus is equipment that etches or rinses the substrates with a substrate treatment liquid, and
   the second substrate treatment apparatus is equipment that dries the substrates using a spin-drying process or a supercritical drying process.

17. A substrate treatment system comprising:
   a first substrate treatment apparatus;
   a second substrate treatment apparatus;
   a transfer unit transporting a container with a plurality of substrates accommodated therein from the first substrate treatment apparatus to the second substrate treatment apparatus; and
   a substrate inspection apparatus inspecting the substrates, wherein
   the substrate inspection apparatus includes an illumination module, which illuminates in a direction where the substrates are located, a camera module, which acquires images related to the substrates when the substrates are illuminated, and a control module, which inspects the substrates based on the images,
   the first substrate treatment apparatus is batch-type equipment,
   the second substrate treatment apparatus is single-type equipment,
   the substrate inspection apparatus inspects the substrates when the transfer unit transports the container, and
   the control module processes the images by extracting regions of interest (ROIs) from the images, binarizing the ROIs, classifying the binarized ROIs into binary large objects (BLOBs), and excluding all the BLOBs except for those associated with reflected light, and inspects the substrates based on a number of BLOBs, which is obtained as a result of the processing of the images, a result of calculation of long-axis lengths of the BLOBs, and a result of measurement of distances between the BLOBs.

18. A substrate inspection apparatus comprising:
   an illumination module illuminating in a direction where a plurality of substrates accommodated in a container are located;

a camera module acquiring images related to the substrates when the substrates are illuminated; and a control module inspecting the substrates based on the images, wherein the control module inspects the substrates when the transfer unit transports the container from a first substrate treatment apparatus to a second substrate treatment apparatus, the first substrate treatment apparatus is batch-type equipment, and the second substrate treatment apparatus is single-type equipment.

19. The substrate inspection apparatus of claim 18, wherein the control module determines at least one of the presence, quantity, installation status, and inclination of the substrates based on a result of the inspection of the substrates.

20. The substrate inspection apparatus of claim 18, wherein the control module processes the images by extracting regions of interest (ROIs) from the images, binarizing the ROIs, classifying the binarized ROIs into binary large objects (BLOBs), and excluding all the BLOBs except for those associated with reflected light, and inspects the substrates based on a number of BLOBs, which is obtained as a result of the processing of the images, a result of calculation of long-axis lengths of the BLOBs, and a result of measurement of distances between the BLOBs.

* * * * *